(12) United States Patent
Hirigoyen

(10) Patent No.: US 10,388,686 B2
(45) Date of Patent: Aug. 20, 2019

(54) IMAGE SENSOR INCLUDING ONE OR MORE MICROLENSES PROVIDED WITHIN A METALLIZATION LAYER

(71) Applicant: STMicroelectronics (Grenoble 2) SAS, Grenoble (FR)

(72) Inventor: Flavien Hirigoyen, Sassenage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 15/357,493

(22) Filed: Nov. 21, 2016

(65) Prior Publication Data

US 2018/0145103 A1 May 24, 2018

(51) Int. Cl.
*H01L 27/146* (2006.01)

(52) U.S. Cl.
CPC .... *H01L 27/14627* (2013.01); *H01L 27/1462* (2013.01); *H01L 27/14636* (2013.01); *H01L 27/14643* (2013.01)

(58) Field of Classification Search
CPC ......... H01L 27/14627; H01L 27/14621; H01L 27/14687; H01L 27/14636; H01L 27/14685; H01L 27/14645; H01L 27/14667
See application file for complete search history.

(56) References Cited

U.S. PATENT DOCUMENTS

| | | | |
|---|---|---|---|
| 2008/0038862 A1 | 2/2008 | Yin et al. | |
| 2008/0042177 A1* | 2/2008 | Park | H01L 27/14625 257/294 |
| 2008/0081396 A1* | 4/2008 | Hong | H01L 27/14625 438/70 |
| 2009/0127601 A1 | 5/2009 | Song | |

* cited by examiner

*Primary Examiner* — Thanh Y. Tran
(74) *Attorney, Agent, or Firm* — Crowe & Dunlevy

(57) ABSTRACT

A image sensor includes a semiconductor substrate with a photosensitive region. Metallization layers are stacked over the semiconductor substrate. Each metallization layer includes an etch stop layer and a dielectric layer on the etch stop layer. At least one metallization layer includes one or more microlenses positioned over the photosensitive region. The one or more microlenses are integrally formed by the etch stop layer.

9 Claims, 8 Drawing Sheets

IMAGE SENSOR INCLUDING ONE OR MORE MICROLENSES PROVIDED WITHIN A METALLIZATION LAYER

TECHNICAL FIELD

The present invention relates to an integrated circuit image sensor including a microlens and, in particular, to the integration of one or more microlenses at the level of a metallization layer.

BACKGROUND

It is well known in the art for an integrated circuit image sensor to include an array of microlenses positioned above an array of photosensitive circuits (such as a photodiode array). A typical implementation is presented in FIG. 1 showing a cross-sectional illustration of an integrated circuit image sensor. The integrated circuit image sensor 10 includes a semiconductor substrate 12 having a top surface at which photosensitive circuits 14 are formed. Such photosensitive circuits 14 may, for example, comprise photodiode devices (such as a pinned photodiode or a single photon avalanche diode). Auxiliary electronic circuits 11, such as transistors, capacitors, etc., are also supported on and/or in the semiconductor substrate 12 and electrically coupled to the photosensitive circuits 14. An example of a MOSFET transistor comprising such auxiliary electronic circuits 11 is explicitly shown in FIG. 1. A premetallization dielectric layer 16 is provided on the semiconductor substrate 12. The premetallization dielectric layer 16 includes electrical contact structures 13 for making electrical contact to diffusions in the top surface of the semiconductor substrate 12 and to the auxiliary electronic circuits (in the illustrated example, contact structure 13 makes an electrical connection to the transistor gate and similar contact structures (not shown) may be used to connect to the source/drain regions as well as the diffusions of the photodiode). A plurality of metallization layers M1-Mn are provided above the premetallization dielectric layer 16 (where n is integer typically in the range of 3-7). Each of the metallization layers M1-Mn is formed by a layer of dielectric material 18 that includes metal wiring structures 20 and may further include metal via structures 22. A protective layer 26 is provided on the top-most metallization layer Mn. The protective layer 26 may, for example, be formed of multiple distinct layers (not explicitly shown) and include a layer configured to function as an optical filter and a layer configured to ensure a planar top surface 30. A plurality of microlenses 34 are formed on the planar top surface 30, with each microlens 34 associated with a corresponding one of the photosensitive circuits 14. The microlenses 34 are typically formed by a lithographically patterned and thermally shaped layer of organic material.

There are concerns, however, with integrated circuit image sensors implemented with microlenses 34 in the manner shown by FIG. 1. The use of organic material for the making of the microlenses 34 may be prohibited in some applications. An example of this is for image sensors used in automotive applications where the microlenses 34 may be subjected to humidity and suffer from reliability issues. Another example is in the context of 3D (three-dimensional) stacked products where the microlenses 34 cannot be processed at the passivation layer for planarity compatibility. There is a need in the art to address the foregoing problems and provide an alternative configuration for microlens structures in image sensing applications.

SUMMARY OF THE INVENTION

It is to be understood that both the foregoing general description and the following detailed description are exemplary and explanatory and are intended to provide further explanation of the invention as claimed.

In an embodiment, an image sensor comprises: a semiconductor substrate including a photosensitive region; a plurality of metallization layers stacked over the semiconductor substrate, wherein each metallization layer includes an etch stop layer and a dielectric layer on said etch stop layer; wherein at least one metallization layer of said plurality of metallization layers includes at least one microlens positioned over the photosensitive region, said at least one microlens being integrally formed by the etch stop layer.

In an embodiment, an image sensor comprises: a semiconductor substrate including a photosensitive region; a metallization layer over the semiconductor substrate; wherein said metallization layer includes: an etch stop layer with at least one integrally formed microlens positioned over the photosensitive region; a dielectric layer on said etch stop layer and microlens; and a metal wiring structure.

In an embodiment, a method comprises: depositing a layer of etch stop material on an underlying metallization layer; depositing a resist layer on the layer of etch stop material; patterning and shaping the resist layer to form at least one lens shape; performing an etch to transfer said at least one lens shape to the layer of etch stop material so as to produce an etch stop layer with at least one integrally formed microlens; depositing a first layer of dielectric material over the etch stop layer with the at least one integrally formed microlens; and forming a metal wiring structure in the first layer of dielectric material.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
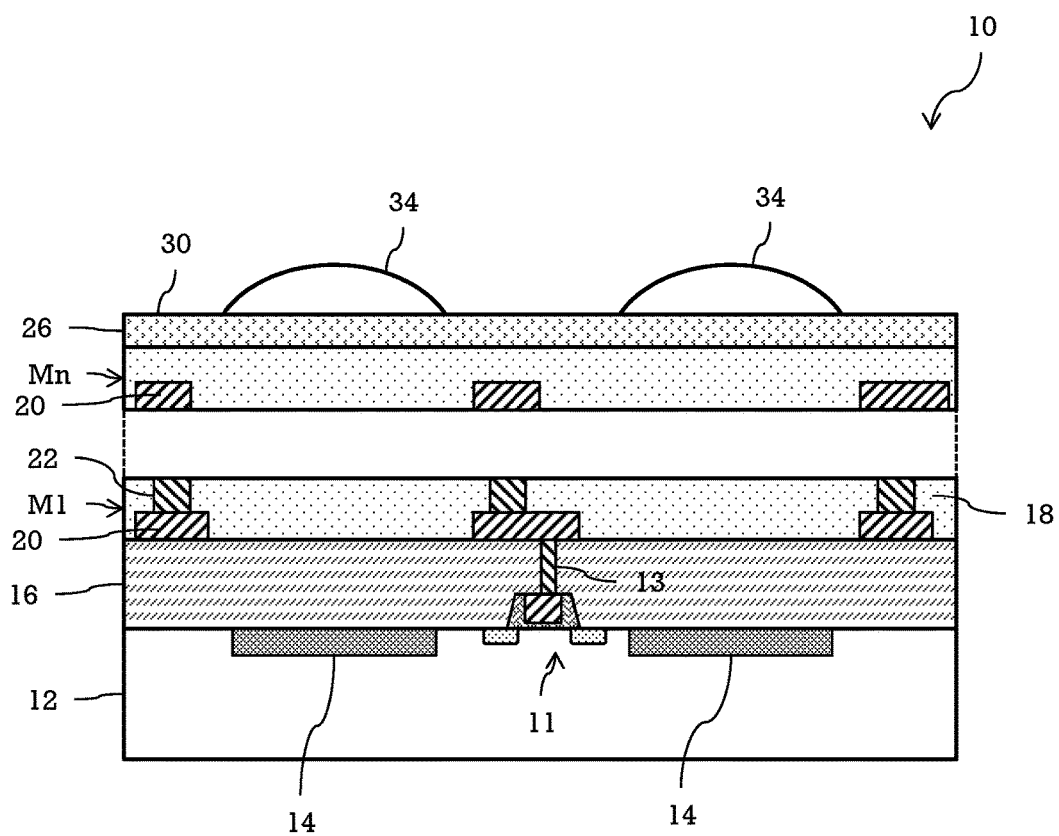
FIG. 1 is a cross-sectional illustration of a conventional integrated circuit image sensor configuration.
Figure 2A:
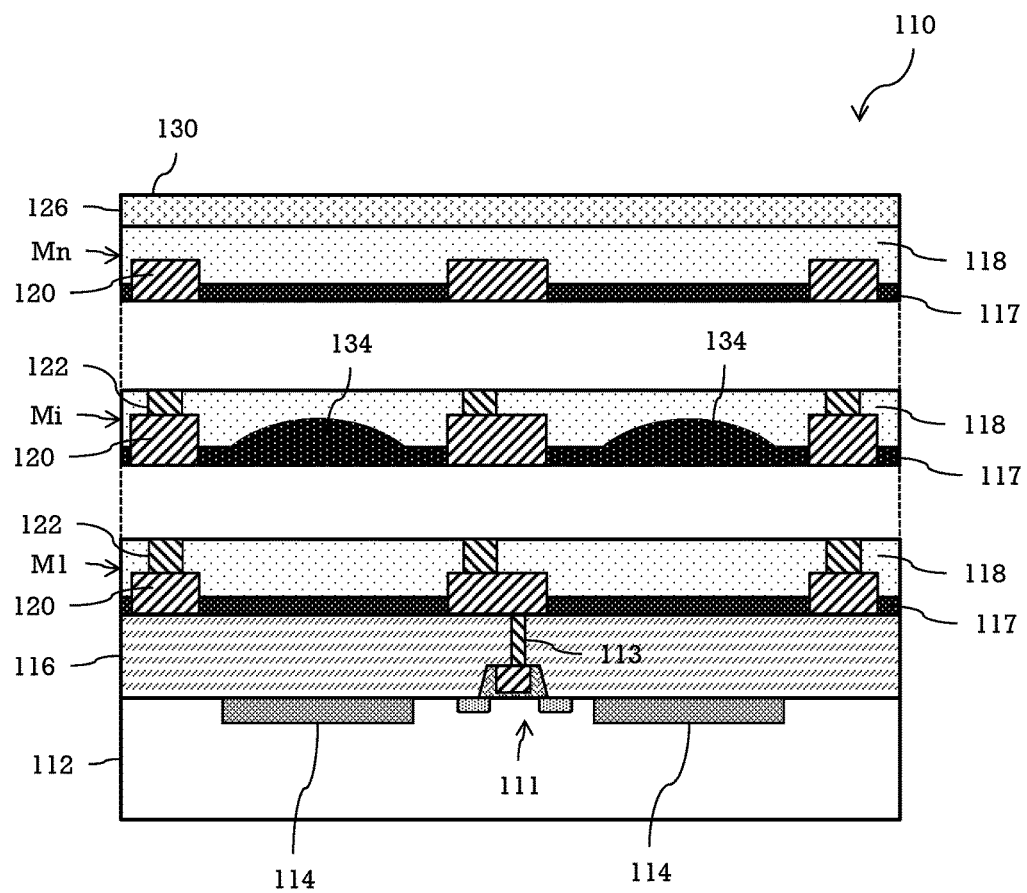
FIGS. 2A-2B and 3A-3B are cross-sectional illustrations of an integrated circuit image sensor configuration with improved microlens structures.
Figure 2B:
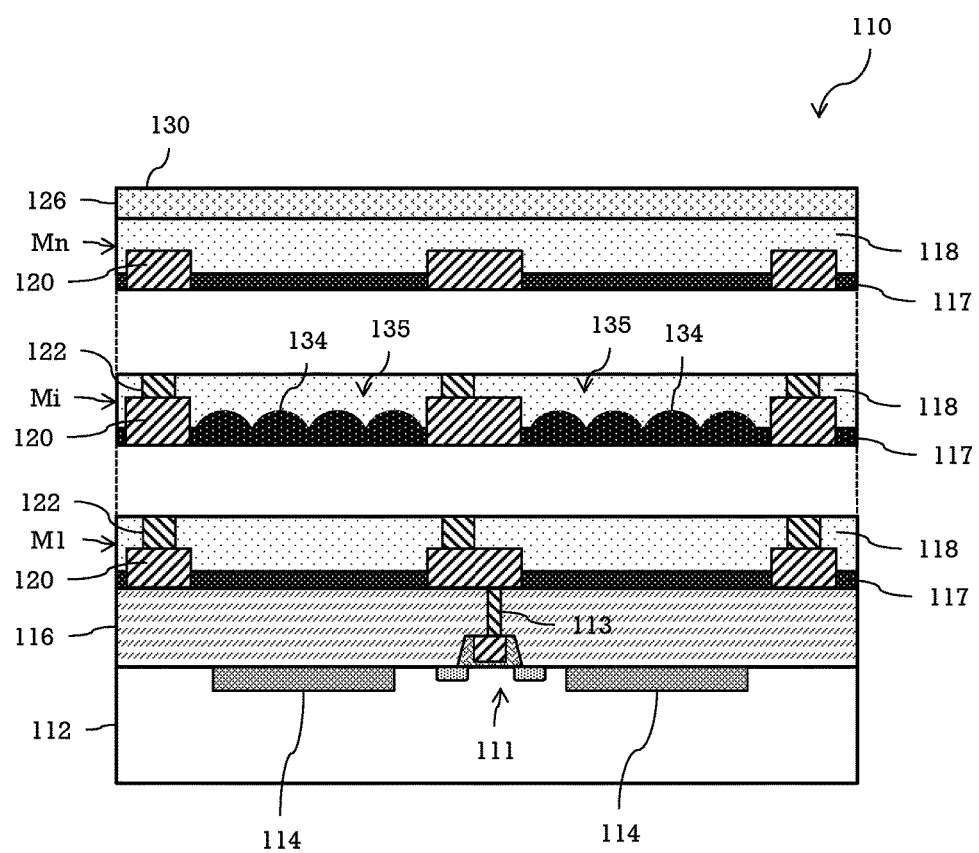

Reference is now made to FIG. 2A-2B showing cross-sectional illustrations of an integrated circuit image sensor configuration with improved microlens structures. The integrated circuit image sensor 110 includes a semiconductor substrate 112 having a top surface at which photosensitive circuits 114 are formed. Such photosensitive circuits 114 may, for example, comprise photodiode devices (such as a pinned photodiode or a single photo avalanche diode). Auxiliary electronic circuits 111, such as transistors, capacitors, etc., are also supported on and/or in the semiconductor substrate 112 and electrically coupled to the photosensitive circuits 114. An example of a MOSFET transistor as such an auxiliary electronic circuit 11 is explicitly shown in FIGS. 2A-2B. A premetallization dielectric layer 116 is provided on the semiconductor substrate 112. The premetallization dielectric layer 116 includes electrical contact structures 113 for making electrical contact to diffusions in the top surface of the semiconductor substrate 112 and to the auxiliary electronic circuits (in the illustrated example, contact structure 113 makes an electrical connection to the transistor gate and similar contact structures (not shown) may be used to connect to the source/drain regions as well as the diffusions of the photodiode). A plurality of metallization layers M1-Mn are provided above the premetallization dielectric layer 116 (where n is an integer typically in the range of 3-7).

Figure 3A:
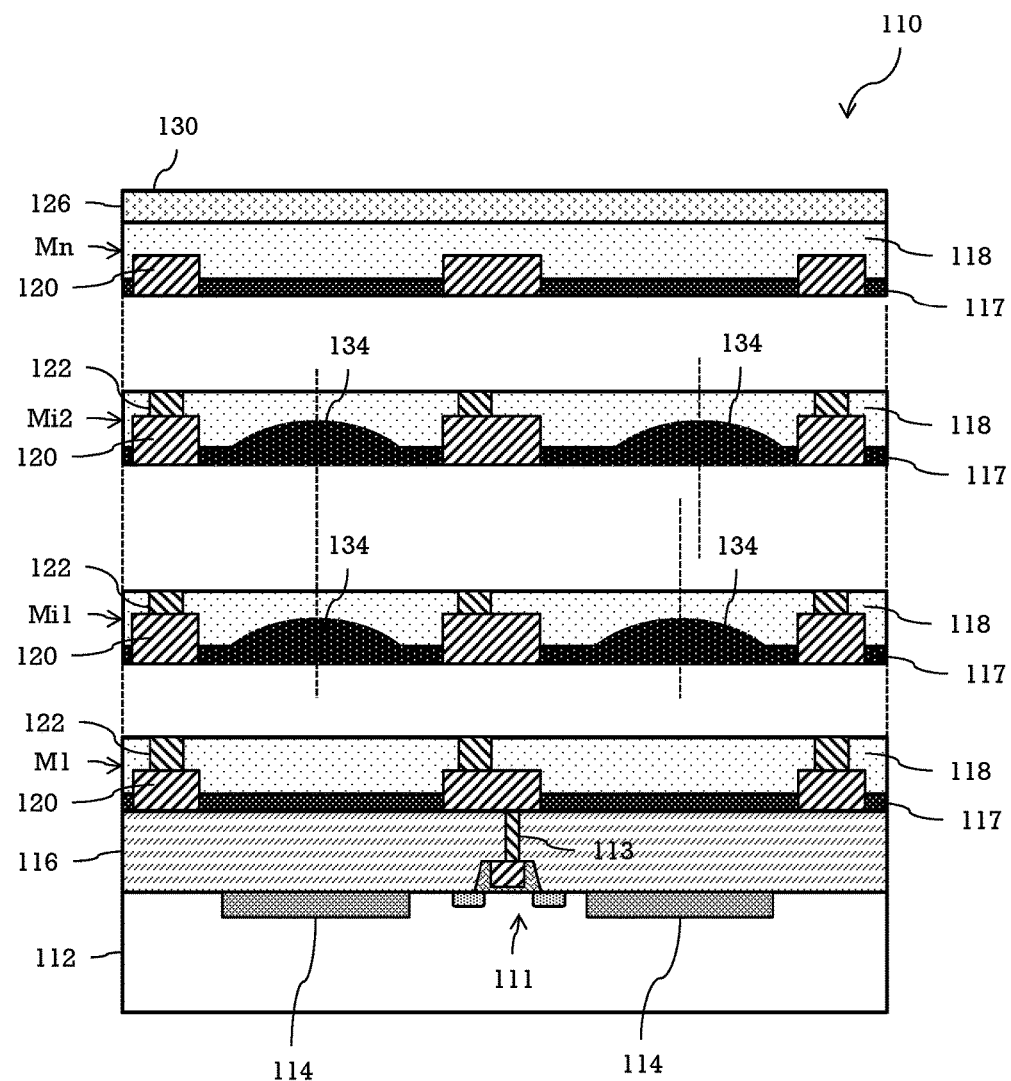
Figure 3B:
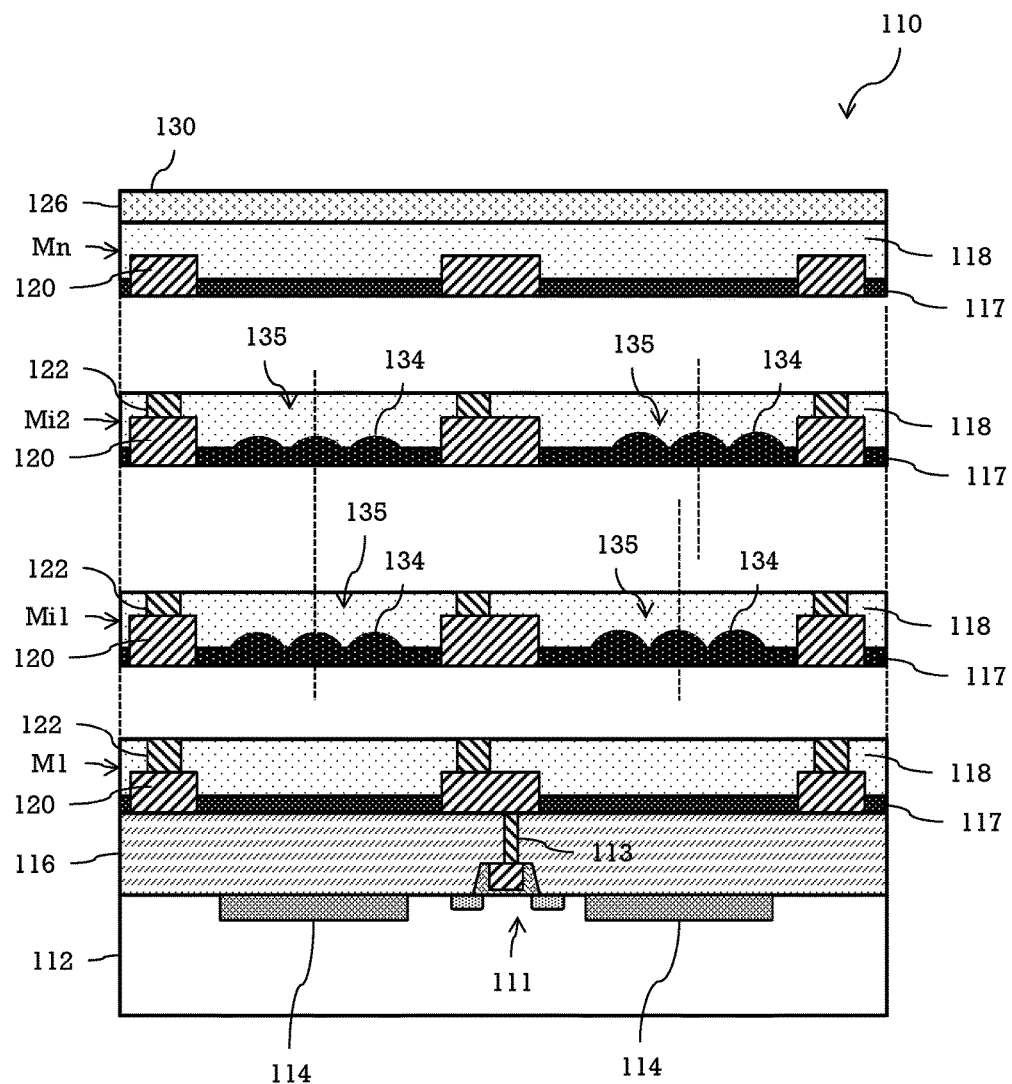

Each of the metallization layers M1-Mn is formed by a nitride barrier layer 117 and a layer of dielectric material 118 that includes metal wiring structures 120 and may further include metal via structures 122. At one or more intermediate metallization layers Mi of the plurality of metallization layers M1-Mn, the nitride barrier layer 117 is shaped to integrally form one or more microlenses 134. In one implementation shown in FIG. 2A, there is a one to one correspondence of a microlens 134 to a photosensitive circuit 114. In another implementation shown in FIG. 2B, an array 135 of microlenses 134 is associated with each photosensitive circuit 114. In this context, integrally formed means that the microlens 134 is part of the nitride barrier layer 117 in the form of a unitary construction and/or a single component or part. FIGS. 2A-2B show the inclusion of just a single intermediate metallization layer Mi with the integrally formed microlenses 134 in the image sensor. FIGS. 3A-3B show an implementation that uses plural intermediate metallization layers Mi1 and Mi2 that each include integrally formed microlenses 134 (with either a one to one correspondence or an array 135 configuration).

A protective layer 126 is provided on the top-most metallization layer Mn. The protective layer 26 may, for example, be formed of multiple distinct layers (not explicitly shown) and include a layer configured to function as an optical filter and a layer configured to ensure a planar top surface 130.

The nitride barrier layer 117 may, for example, be formed of a suitable etch stop material such as SiN, SiC or SiCN.

For the nitride barrier layer 117 which includes the integrally formed microlenses 134, that nitride barrier layer 117 includes a top surface having a shape which provides for the desired optical properties of the microlens. Furthermore, the materials for the nitride barrier layer 117 and the layer of dielectric material 118 are selected in order to provide a desired relationship between indices of refraction. For example, if the microlens 134 has a convex shape (i.e., the shape of the top surface of the nitride barrier layer 117 at the microlens 134 is convex and the bottom surface of the nitride barrier layer 117 at the microlens 134 is flat), it is preferred that the index of refraction for the nitride barrier layer 117 be greater than the index of refraction for the overlying layer of dielectric material 118 to for a positive lens. Conversely, to form a negative lens, it is preferred that the index of refraction for the nitride barrier layer 117 be less than the index of refraction for the overlying layer of dielectric material 118.

Although the integrally formed microlenses 134 are shown as having a hemispherical convex shape, it will be understood that this is by way of example only. The surface shape of the integrally formed microlenses 134 may be selected as needed for a given application.

In an implementation where the image sensor includes plural intermediate metallization layers Mi1 and Mi2 with integrally formed microlenses 134, the microlenses associated with a given one of the photosensitive circuits 114 may having their optical axes aligned (as shown with the dotted line in left hand side of FIGS. 3A and 3B) or offset (as shown with the two dotted lines in the right hand side of FIGS. 3A and 3B). The offsetting of optical axes may be provided to address issues with respect to the alignment of the chief ray angle (CRA) and vignetting and so as to implement radial shifting. Techniques for setting the optical axis offset are well known in the art. In the array 135 implementation of FIG. 3B, the offset optical axes refer to the axes of the array 135 of microlenses.

In an example implementation, each microlens 134 may have a maximum thickness in a range of 10 nm to 1 µm. The thickness of the nitride barrier layer 117 outside of the area of the microlens 134 may be 40-400 nm. Each microlens 134 with the convex shape may further have a radius of curvature in the range of 100 nm to 10 µm depending on microlens base dimension.

Reference is now made to FIGS. 4A-4I showing process steps for fabricating a metallization layer including an integrally formed microlens.

Figure 4A:
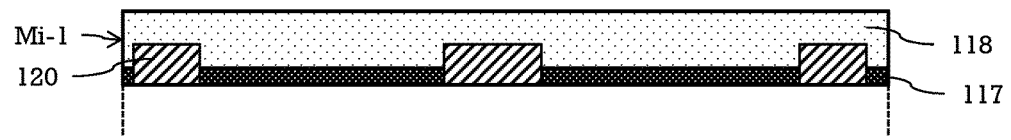
FIGS. 4A-4I show process steps for fabricating a metallization layer including an integrally formed microlens.

FIG. 4A shows a lower metallization layer Mi-1 of a standard construction including a nitride barrier layer 117 and a layer of dielectric material 118 that includes metal wiring structures 120. The next metallization layer Mi is an intermediate layer designed to include the microlenses 134.

Figure 4B:
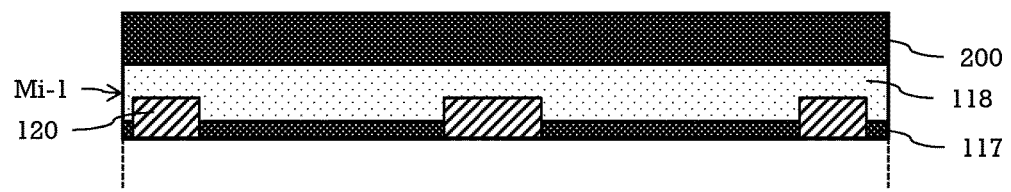

A thick nitride barrier layer 200 is deposited on top of the layer of dielectric material 118 of the lower metallization layer Mi-1. The nitride barrier layer 200 may, for example, have a thickness of 400 nm. This is considerably thicker than the thickness of 40 nm for the nitride barrier layer 117 of the underlying lower metallization layer Mi-1. The result is shown in FIG. 4B.

Figure 4C:
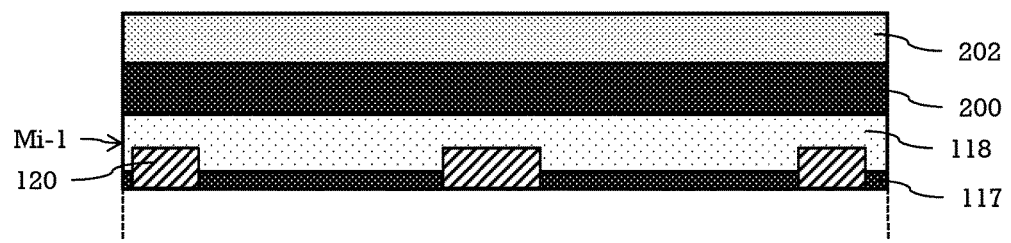

Next, a layer 202 of photoresist material is deposited on the thick nitride barrier layer 200. The result is shown in FIG. 4C.

Figure 4D:
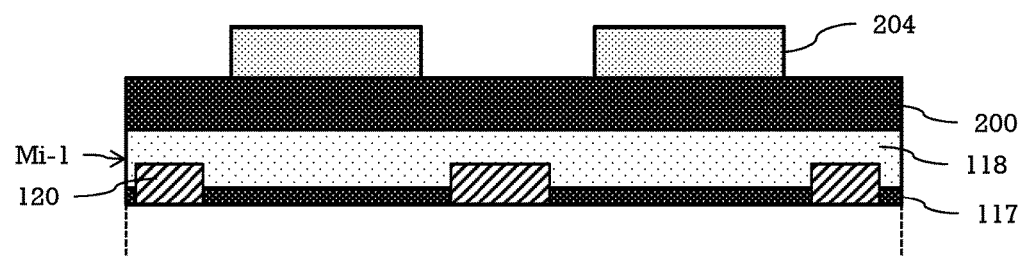

Using conventional lithographic processing techniques, the layer 202 of photoresist material is patterned to produce a resist blocks 204 at locations where microlenses 134 are to be formed. The result is shown in FIG. 4D.

Figure 4E:
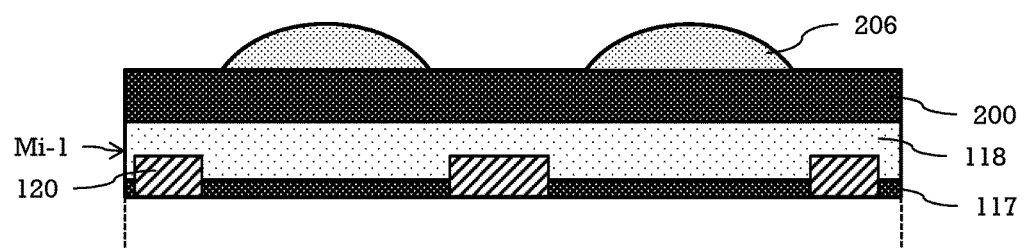

A heat treatment bake is then performed to change the shape of the resist blocks 204 and form convex shaped blocks 206. The bake can, for example, be made at a temperature of about 200° C. The result is shown in FIG. 4E.

Figure 4F:
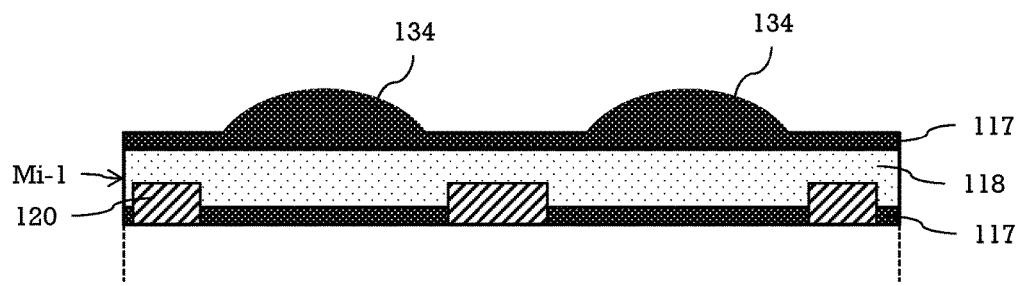

Next, an etch process is performed to transfer the shape of the resist blocks 204 to the thick nitride barrier layer 200. The etch used is any standard etching process suited to the resist and nitride barrier materials. The etch process reduces the thickness of the thick nitride barrier layer 200 and produces the nitride barrier layer 117 with integrally formed microlenses 134. The result is shown in FIG. 4F.

Figure 4G:
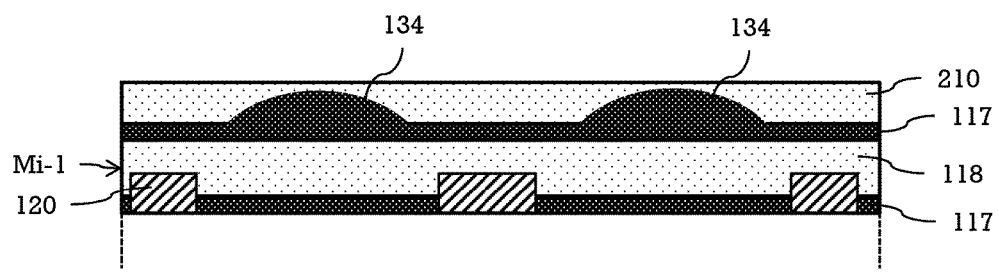

A first layer 210 of dielectric material is deposited to cover the nitride barrier layer 117 with integrally formed microlenses 134. The result is shown in FIG. 4G.

Figure 4H:
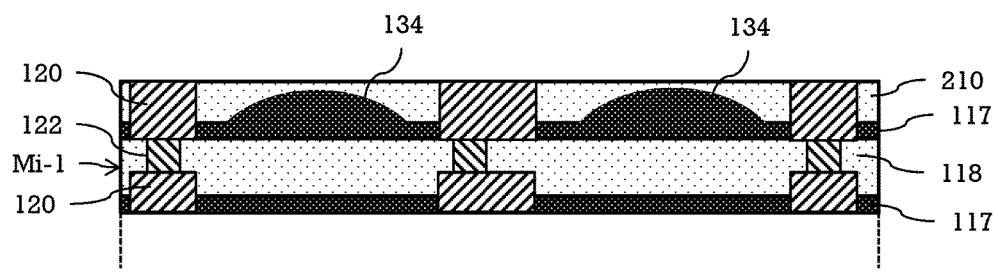

Using a conventional damascene process well known in the art, the metal via structures 122 are formed in the lower metallization layer Mi-1 and the metal wiring structures 120 are formed in the metallization layer Mi. The result is shown in FIG. 4H.

Figure 4I:
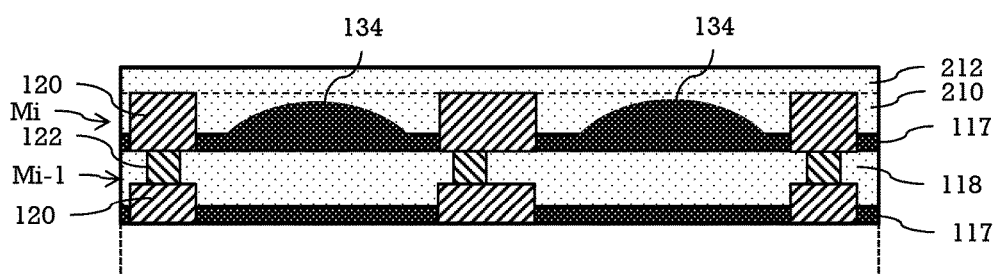

A second layer 212 of dielectric material is then deposited to cover the first layer 210. The result is shown in FIG. 4I. The first and second layers 210 and 212 form the layer of dielectric material 118 for the metallization layer Mi.

Further back end of line (BEOL) processing may be performed as needed to add additional metallization layers or other layers.

In the case where plural metallization layers including integrally formed microlenses 134 are needed, the process of FIGS. 4A-4I can be repeated as needed at the desired metallization layer level.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An image sensor, comprising:
a semiconductor substrate including a photosensitive region;
a plurality of metallization layers stacked over the semiconductor substrate, wherein each metallization layer includes an etch stop layer and a dielectric layer on said etch stop layer; and
wherein at least one metallization layer of said plurality of metallization layers includes at least one microlens positioned over the photosensitive region, said at least one microlens being integrally formed by the etch stop layer; and
wherein said at least one microlens has a convex shape with a convex surface oriented to face away from the photosensitive region; and
wherein the etch stop layer of another metallization layer of said plurality of metallization layers, said another metallization layer being located further away from the semiconductor substrate than said at least one metallization layer, is positioned to extend over said at least one microlens such that light directed by the at least one microlens to the photosensitive region passes through the etch stop layer of said another metallization layer.

2. The image sensor of claim 1, wherein an index of refraction of the etch stop layer is less than an index of refraction of the dielectric layer.

3. The image sensor of claim 1, wherein an index of refraction of the etch stop layer is greater than an index of refraction of the dielectric layer.

4. The image sensor of claim 1, wherein said at least one metallization layer that includes the integrally formed microlens further includes a metal wiring structure.

5. The image sensor of claim 4, wherein said at least one metallization layer that includes the integrally formed microlens further includes a metal via in electrical contact with the metal wiring structure.

6. An image sensor, comprising:
a semiconductor substrate including a photosensitive region;
a plurality of metallization layers stacked over the semiconductor substrate, wherein each metallization layer includes an etch stop layer and a dielectric layer on said etch stop layer; and
wherein at least one metallization layer of said plurality of metallization layers includes at least one microlens positioned over the photosensitive region, said at least one microlens being integrally formed by the etch stop layer; and
wherein the dielectric layer of said at least one metallization layer which includes the at least one microlens comprises a first dielectric layer on the etch stop layer and said at least one microlens, a second dielectric layer in contact with the first dielectric layer; and
wherein said at least one metallization layer which includes the at least one microlens comprises a metal wiring structure extending through the first dielectric layer and a metal via structure extending through the second dielectric layer to contact the metal wiring structure.

7. The image sensor of claim 6, wherein an index of refraction of the etch stop layer is less than an index of refraction of the dielectric layer.

8. The image sensor of claim 6, wherein an index of refraction of the etch stop layer is greater than an index of refraction of the dielectric layer.

9. The image sensor of claim 6, wherein said at least one microlens has a convex shape.

\* \* \* \* \*